(12) United States Patent
Bohr et al.

(10) Patent No.: US 12,074,138 B2
(45) Date of Patent: Aug. 27, 2024

(54) HYPERCHIP

(71) Applicant: Intel Corporation, Santa Clara, CA (US)

(72) Inventors: Mark T. Bohr, Aloha, OR (US); Wilfred Gomes, Portland, OR (US); Rajesh Kumar, Portland, OR (US); Pooya Tadayon, Portland, OR (US); Doug Ingerly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/378,978

(22) Filed: Oct. 11, 2023

(65) Prior Publication Data

US 2024/0038722 A1 Feb. 1, 2024

Related U.S. Application Data

(60) Division of application No. 17/226,967, filed on Apr. 9, 2021, now Pat. No. 11,824,041, which is a (Continued)

(51) Int. Cl.
*H01L 25/065* (2023.01)
*H01L 23/00* (2006.01)
(Continued)

(52) U.S. Cl.
CPC ...... *H01L 25/0655* (2013.01); *H01L 23/5226* (2013.01); *H01L 23/5384* (2013.01); *H01L 24/13* (2013.01); *H01L 2225/06541* (2013.01)

(58) Field of Classification Search
None
See application file for complete search history.

(56) References Cited

U.S. PATENT DOCUMENTS 8,765,598 B2 7/2014 Smith
11,024,601 B2 6/2021 Bohr
(Continued)

FOREIGN PATENT DOCUMENTS

CN 103548131 A 1/2014
CN 103811506 A 5/2014
(Continued)

OTHER PUBLICATIONS

International Preliminary Report on Patentability for International Patent Application No. PCT/US2017/068049, mailed Jul. 11, 2019, 10 pages.
(Continued)

*Primary Examiner* — Alexander G Ghyka
(74) *Attorney, Agent, or Firm* — Schwabe, Williamson & Wyatt P.C.

(57) ABSTRACT

Hyperchip structures and methods of fabricating hyperchips are described. In an example, an integrated circuit assembly includes a first integrated circuit chip having a device side opposite a backside. The device side includes a plurality of transistor devices and a plurality of device side contact points. The backside includes a plurality of backside contacts. A second integrated circuit chip includes a device side having a plurality of device contact points thereon. The second integrated circuit chip is on the first integrated circuit chip in a device side to device side configuration. Ones of the plurality of device contact points of the second integrated circuit chip are coupled to ones of the plurality of device contact points of the first integrated circuit chip. The second integrated circuit chip is smaller than the first integrated circuit chip from a plan view perspective.

20 Claims, 8 Drawing Sheets

Related U.S. Application Data continuation of application No. 16/348,448, filed as application No. PCT/US2017/068049 on Dec. 21, 2017, now Pat. No. 11,024,601.

(60) Provisional application No. 62/440,275, filed on Dec. 29, 2016.

(51) Int. Cl.
 *H01L 23/522* (2006.01)
 *H01L 23/538* (2006.01)

(56) References Cited

U.S. PATENT DOCUMENTS

| | | | |
|---|---|---|---|
| 2011/0227201 A1 | 9/2011 | Too | |
| 2011/0316147 A1 | 12/2011 | Shih et al. | |
| 2013/0217188 A1 | 8/2013 | Wang et al. | |
| 2014/0210097 A1 | 7/2014 | Chen et al. | |
| 2015/0235949 A1 | 8/2015 | Yu | |
| 2015/0235992 A1 | 8/2015 | Karikalan | |
| 2015/0289360 A1 | 10/2015 | Leong et al. | |
| 2015/0340314 A1* | 11/2015 | Kim | H01L 23/481 257/773 |
| 2016/0343773 A1* | 11/2016 | Tan | H10N 70/063 |
| 2017/0309667 A1* | 10/2017 | Yamashita | H01L 27/14643 |
| 2018/0190617 A1* | 7/2018 | Chew | H01L 25/50 |
| 2018/0240778 A1* | 8/2018 | Liu | H01L 23/5381 |
| 2018/0366429 A1* | 12/2018 | Chiu | H01L 23/5384 |
| 2021/0225808 A1 | 7/2021 | Bohr | |

FOREIGN PATENT DOCUMENTS

| | | |
|---|---|---|
| CN | 103824842 A | 5/2014 |
| CN | 103972224 A | 8/2014 |
| CN | 104979334 A | 10/2015 |
| CN | 106463489 A | 2/2017 |
| KR | 10-20140000719 | 1/2014 |

OTHER PUBLICATIONS

International Search Report and Written Opinion for International Patent Application No. PCT/US2017/068049 mailed Jun. 25, 2018, 13 pgs.

Office Action for Korean Patent Application No. 2019-7015363 mailed Jan. 30, 2023, 19 pgs., with English translation.

Office Action from Chinese Application No. 201780073754.1 mailed Oct. 9, 2022, 9 pgs.

Office Action from Chinese Application No. 201780073754.1 mailed Jun. 29, 2023, 8 pgs.

Office Action from U.S. Appl. No. 17/226,967, mailed May 4, 2023, 8 pgs.

Notice of Allowance from U.S. Appl. No. 17/226,967, mailed Jul. 19, 2023, 6 pgs.

Office Action from U.S. Appl. No. 18/128,958, mailed Oct. 12, 2023, 9 pgs.

Office Action for Korean Patent Application No. 2019-7015363 mailed Aug. 28, 2023, 8 pgs.

Notice of Allowance from U.S. Appl. No. 18/128,958, mailed Jan. 24, 2024, 7 pgs.

Notice of Allowance from Chinese Patent Application No. 201780073754.1, mailed Sep. 28, 2023, 4 pgs.

Office Action from Korean Patent Application No. 10-2023-7010196, mailed Nov. 7, 2023, 9 pgs.

Office Action for Korean Patent Application No. 10-2023-7010196 mailed May 8, 2024, 8 pgs.

\* cited by examiner

HYPERCHIP

CROSS-REFERENCE TO RELATED APPLICATIONS

This patent application is a divisional of U.S. patent application Ser. No. 17/226,967, filed Apr. 9, 2021, which is a continuation of U.S. patent application Ser. No. 16/348,448, filed May 8, 2019, now U.S. Pat. No. 11,024,601, issued Jun. 1, 2021, which is a U.S. National Phase Application under 35 U.S.C. § 371 of International Application No. PCT/US2017/068049, filed Dec. 21, 2017, entitled "HYPERCHIP," which designates the United States of America, which claims the benefit of U.S. Provisional Application No. 62/440,275, entitled "HYPERCHIP," filed on Dec. 29, 2016, the entire contents of which are hereby incorporated by reference herein.

TECHNICAL FIELD

Embodiments of the disclosure are in the field of integrated circuit assembly and, in particular, hyperchip structures and methods of fabricating hyperchips.

BACKGROUND

Modern packaging techniques often call for maximizing the number of die-to-die connections. Traditional solutions to this challenge are categorized as 2.5D solutions, utilizing a silicon interposer and through silicon vias (TSVs) to connect die using interconnects with a density and speed typical for integrated circuits in a minimal footprint. The result is increasingly complex layouts and manufacturing techniques that depress yield rates.

DESCRIPTION OF THE EMBODIMENTS

Figure 1:
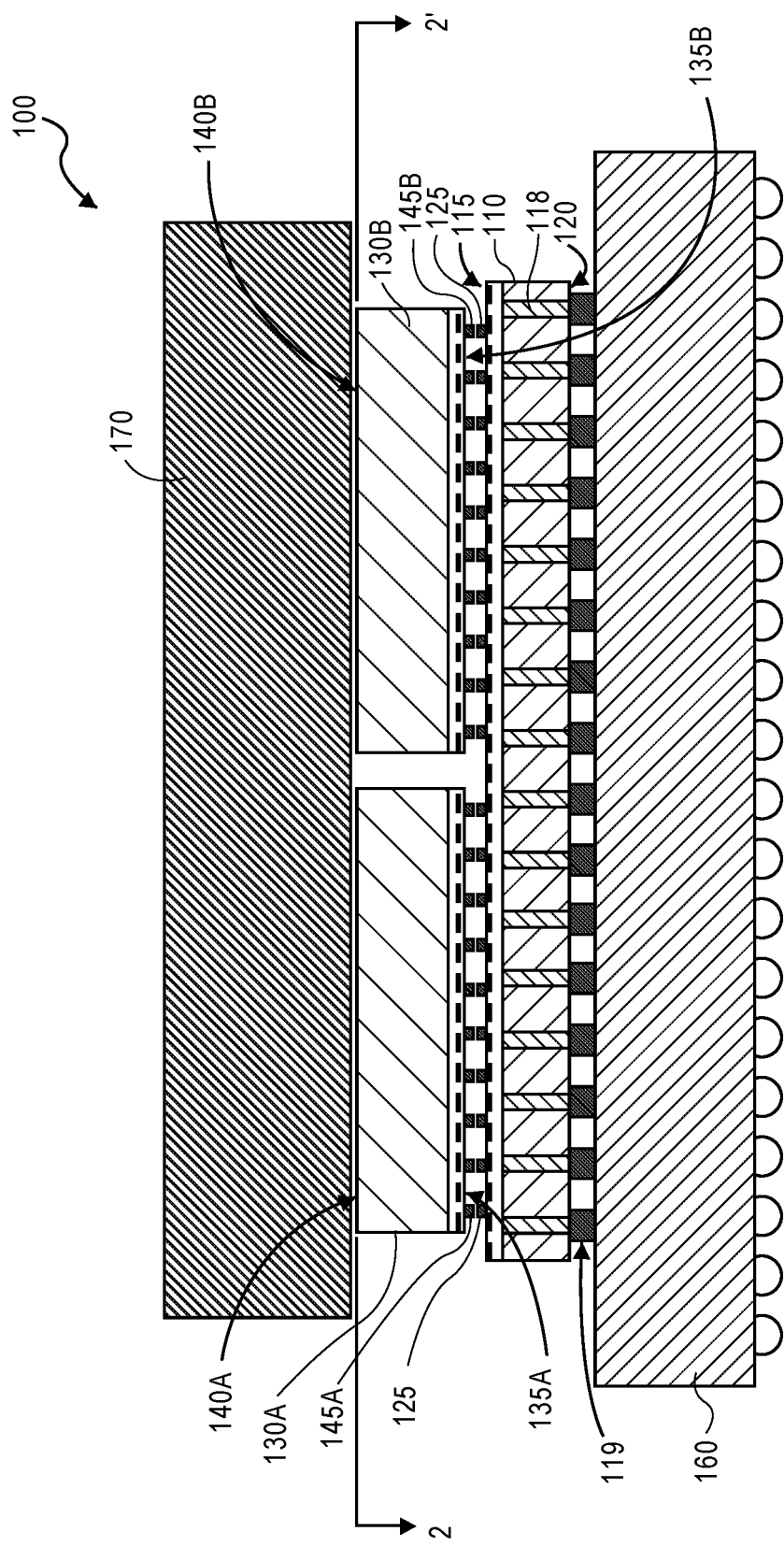
FIG. 1 illustrates a cross-sectional side view of an embodiment of an integrated circuit assembly.

Hyperchip structures and methods of fabricating hyperchips are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

In accordance with one or more embodiments of the present disclosure, an integrated circuit assembly is described including a first integrated circuit chip or die that may be characterized as an active interposer substrate connected to one or more other die in a three-dimensional stacked arrangement. In one embodiment, the first integrated circuit die or active interposer die utilizes a technology operable for a low cost input/output (I/O) and analog circuits as well as memory circuits (e.g., static random access memory (SRAM)) and power delivery. The one or more second integrated circuit chip or die, in one embodiment, utilizes similar technology or, in another embodiment, scaled technologies for high performance such as to implement high performance processing cores, dense graphics, dense modems or other functions. Where multiple dies are connected to the first integrated circuit die, the dies may be the same or different (e.g., one die devoted to cores and another also devoted to cores or graphics or other functionality or functionalities). Thus, in one embodiment, the three-dimensional stacking arrangement allows the relatively more advanced technology to be used on the die(s) connected to the active interposer die (the first integrated circuit die) and allows such die(s) to have a smaller footprint (e.g., smaller die) for higher manufacturing yield. The integrated circuit assembly enables heterogeneous integration of multiple circuit functions, such as central processing units (CPUs), graphics, modems, memory, I/O, analog and power delivery circuits to use process technology optimized for the particular function.

In an embodiment, integration of a die or dies on an active interposer enables a smaller form factor (e.g., smaller package) for products that value small packages and enables reconfiguration capability in the sense that a die or dies on an active interposer die can be replaced with another die including another die that performs a different function(s) and speeds the time to market for chip products. The integrated circuit assembly is applicable to various markets including from relatively small internet of things (IOT) applications to large server applications.

FIG. 1 illustrates a cross-sectional side view of an embodiment of an integrated circuit assembly. Referring to FIG. 1, assembly 100 includes an integrated circuit die 110 that includes a plurality of transistor devices and may therefore characterized as an active interposer. Integrated circuit die 110 includes a device side 115 including a number of transistor devices. In one embodiment, the semiconductor device fabrication node for devices on integrated circuit die 110 is a 22 nm or a 14 nm, or smaller, technology node or some combination thereof. In one embodiment, such technology node may be based on factors such as cost and acceptable performance features. Thus, in one embodiment, device side 115 of die 110 includes circuit devices (e.g., transistor devices) and interconnects routing ones of the devices in the formation of various circuits. In an embodiment, device contact points 125, such as microbumps, are on the device side 115 of die 110, as is depicted. In an embodiment, through silicon vias (TSVs) 118 are disposed through die 110 from device side 115 to backside 120, as is depicted. Backside contacts 119, such as solder bumps, operable to connect die 110 to a package substrate 160, e.g., operable to electrically connect die 110 to die-side contacts of a package substrate, may be disposed on backside 120 of die 110, as is also depicted.

Referring again to FIG. 1, in an embodiment, multiple dies are disposed on device side 115 of die 110. As an example, FIG. 1 shows die 130A and die 130B each connected to die 110. Die 130A and die 130B may be respectively selected for a desired function or functions and may individually include high performance cores, dense graphics, dense modems or other specialized technologies or some combination thereof (e.g., cores, graphics, field programmable arrays (FPGAs), etc.). FIG. 1 shows die 130A including a device side 135A and a backside 140A. Device side 135A representatively includes a number of transistor devices and circuits selected for a particular function or functions of the die, and microbumps 145A connected to corresponding microbumps 125 of die 110. Similarly, die 130B includes a device side 135B and a backside 140B, the device side 130B including a number of transistor devices and circuits selected for a particular function or functions, and microbumps 145B connected to microbumps 125 of die 110. As illustrated, die 130A and die 130B are connected to die 110 in a device side to device side or face-to-face configuration. In one embodiment, microbumps 125 of die 110 utilize a uniform bump pitch and bump pattern to promote both high density and uniform control of bump height to enable reliable bump-to-bump bonding. A representative pitch for the face-to-face bonding through microbumps with, for example, solder is on the order of 50 microns or less such as a pitch of 30 microns to 50 microns to promote high density die-to-die connections. Such a tight pitch provides a large number of connections to provide a generally wide electrical bus between die 130A and die 130B and die 110 and allows communication between die 130A and die 130B through wide bus interconnects in die 110. Since die 110 is effectively an active interposer including transistor devices, the integrated circuit assembly allows, in one example, the use of transistor repeaters to assist signals routed between die 130A and die 130B across the interposer.

As noted above, die 110 includes TSVs 118 that bring electrical conductivity to backside 120 of die 110. Die 110 includes solder bumps 119 connected to TSVs 118. In one embodiment, solder bumps 119 have a pitch on the order of 100 microns or less with such pitch selected for connection to a package such as package substrate 160. As depicted, package substrate 160 may itself include contact points on a side opposite to side connected to die 110 for connection of the package to, for example, a printed circuit board. FIG. 1 further illustrates assembly 100 including heat sink 170 disposed on a portion of the die assembly, e.g., on backside 140A of die 130A and backside 140B of die 130B. In an embodiment, package substrate 160 is an organic package substrate. In another embodiment, package substrate 160 is a ceramic package substrate.

Figure 2:
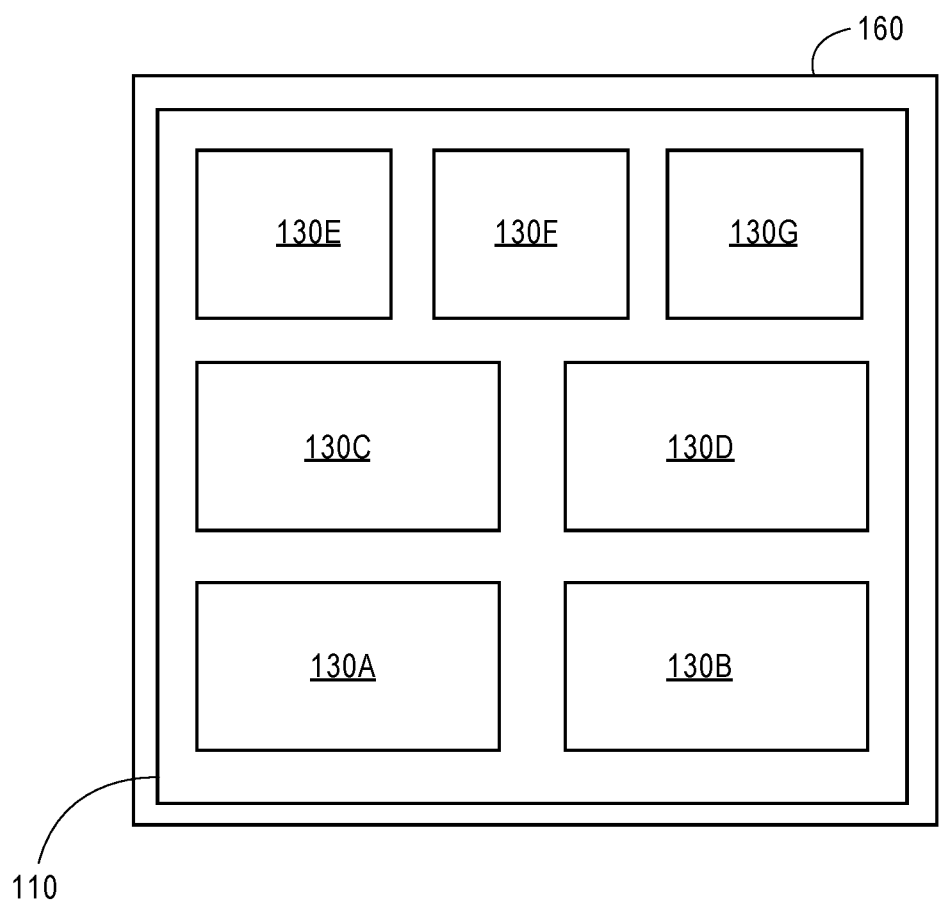
FIG. 2 illustrates a top side plan view of the assembly of FIG. 1 through line 2-2', in accordance with an embodiment of the present disclosure.

FIG. 2 illustrates a top side plan view of the assembly of FIG. 1 through line 2-2', in accordance with an embodiment of the present disclosure. In the embodiment shown, die 130A, die 130B, die 130C, die 130D, die 130E, die 130F and die 130G are disposed and electrically connected to die 110 in a face-to-face bonding configuration. The seven-die example of FIG. 2 is one example of multiple smaller dies being electrically connected to a larger die (e.g., an active interposer die). In one representative example, die 110 has an area onto which dies 130A-130G are mounted that is on the order of 100 mm2 to 1000 mm2. In this example, dies 130A-130G independently each have an area of 20 mm2 to 200 mm2 (where dies 130A-130G may or may not each be of a similar area). It is to be appreciated that the number of dies that may be accommodated on die 110 can vary depending at least in part on the size of the accommodated die(s). In the example of FIG. 2, there are seven dies (e.g., dies 130A-130G). In another embodiment, there may be more or fewer accommodated dies. In one embodiment, the use of dies 130A-130G allows for heterogeneous integration of specialized die with such specialization incorporated in small form factors to produce an integrated circuit assembly including multiple dies connected to an active interposer in the form of die 110. It is to be appreciated that such assemblies may be utilized in various market segments such as personal computing, internet of things (JOT) and server applications. The integrated circuit assembly allows integration of multiple functionalities including, but not limited to, logic memory and the integration of power delivery including modulation and voltage regulation. Further, the assembly may allow for integration of non-silicon technologies such as sensors and optical I/Os into the assembly.

FIGS. 3-12 describe a method of forming an assembly such as the integrated circuit assembly illustrated in FIG. 1 and FIG. 2, in accordance with an embodiment of the present disclosure.

Figure 3:
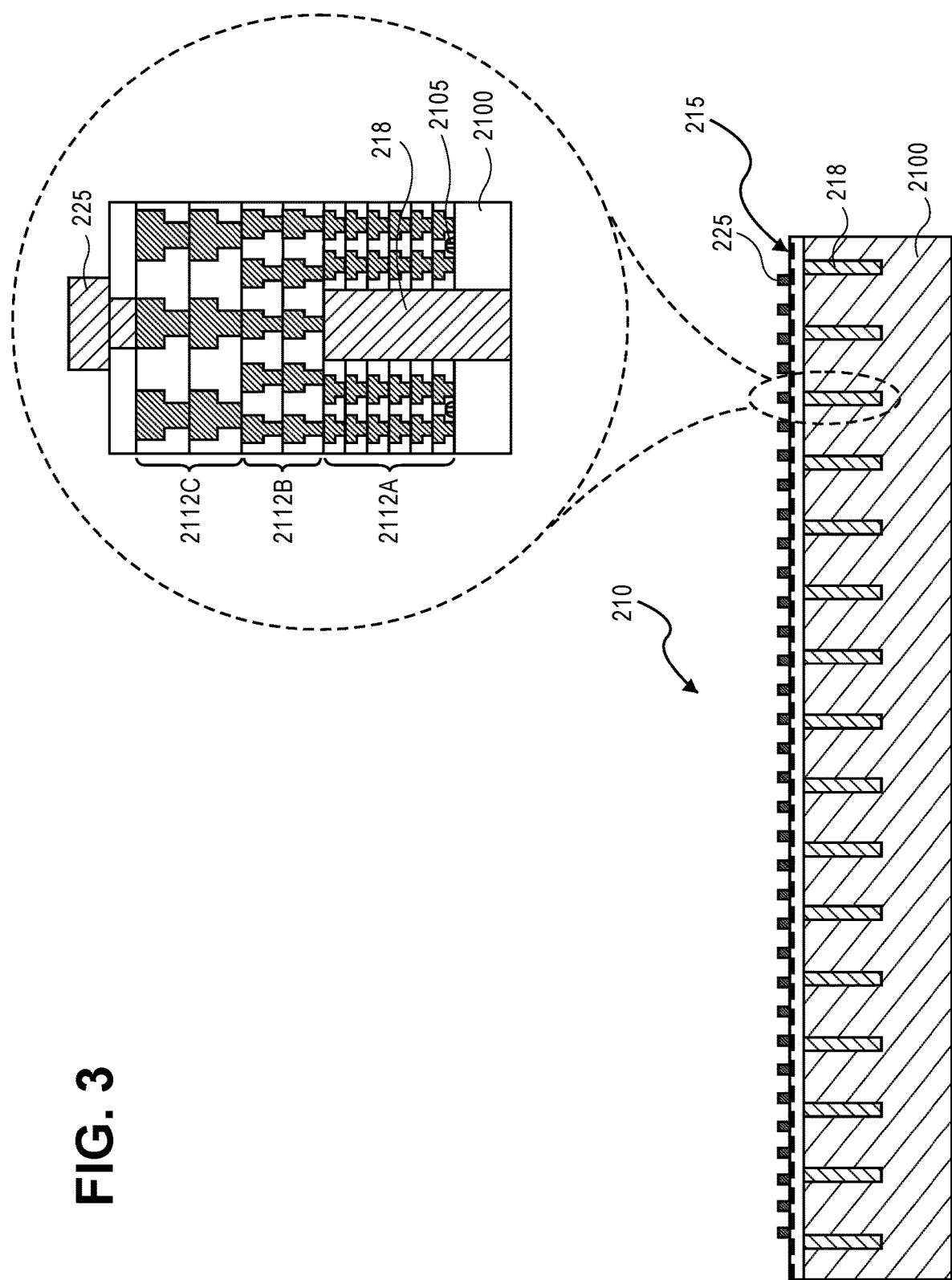
FIG. 3 illustrates a cross-sectional side view of an integrated circuit die that is to serve as an active interposer for an integrated circuit device assembly with the interposer at a point in a manufacturing process that includes formation of through silicon vias (TSVs) through a portion of the substrate of the die, in accordance with an embodiment of the present disclosure.

FIG. 3 illustrates a cross-sectional side view of an integrated circuit die that, in one embodiment, is to serve as an active interposer for an integrated circuit device assembly. Die 210 includes a substrate 2100 that is, for example, a bulk semiconductor substrate (e.g., a silicon substrate) that is part of a larger wafer. Die 210 includes device side 215 onto which transistor devices and interconnects are disposed. In an embodiment, microbumps 225 are connected to the interconnects and devices. In an embodiment, die 210 includes through silicon vias (TSVs) 218 extending at least partially through the substrate (e.g., a silicon substrate).

An inset of FIG. 3 illustrates a representative interconnect structure on device side 215 of die 210. The inset shows substrate 2100 of, for example, a bulk silicon substrate that is a portion of a wafer. In an embodiment, transistor devices 2105 are disposed on substrate 2100. Interconnects are connected to the transistor devices. As an exemplary embodiment, the inset shows ten levels of interconnects (e.g., electrically conductive metal lines or traces) disposed in a dielectric material on substrate 2100 of die 210. In one embodiment, the interconnect levels can be separated into three groups. The interconnects designated in group 2112A represent interconnects formed at or below of a level of height of TSV 218. In this embodiment, interconnects in group 2112A represent the first six levels of metal on substrate 2100 and have a representative pitch on the order of, e.g., 90 nanometers. Since the interconnects are below or at a level of the TSV 218, such interconnects are routed around the TSVs 218 in die 210. Group 2112B is represented by two interconnect levels, e.g., interconnect levels 7 and 8 disposed on the substrate and formed above TSV 218. In one embodiment, interconnects in group 2112B are larger than interconnects in group 2112A and have a representative pitch on the order of, e.g., 360 nanometers. In one embodiment, interconnects in group 2112B may be used to, for example, route signals across substrate 210 for die communication. Interconnects in group 2112C overly interconnects in group 2112B and represent levels 9 and 10 on substrate 2100. Interconnects in group 2112C have a representative pitch on the order of, e.g., 1 micron to 10 microns. Interconnects in group 2112B and group 2112C can be routed over the TSVs 218 in die 210. In one embodiment, interconnects in group 2112A are insulated by a dielectric material or materials having a dielectric constant less than silicon dioxide (a low-k material), and interconnects in group 2112B and 2112C are insulated in a low-k material or a silicon dioxide dielectric material. The inset also depicts microbump 225 electrically connected to a top level interconnect, e.g., an interconnect from group 2112C.

In an embodiment, TSVs 218 are formed using a middle TSV process flow. In one embodiment, a middle TSV process flow is implemented to form TSVs following generally high temperature front end of the line (FEOL) processing. FIGS. 4-9 illustrate one possible embodiment of a middle TSV process flow for forming a TSV on die 210.

Figure 4:
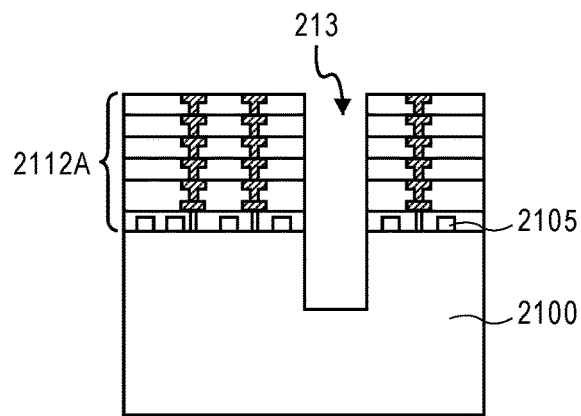
FIG. 4 illustrates a portion of the integrated circuit die of FIG. 3 prior to formation of TSVs therein and shows a via opening formed in the die for a TSV, in accordance with an embodiment of the present disclosure.

In particular, FIG. 4 illustrates a portion of integrated circuit die 210 prior to the formation of TSVs. FIG. 4 shows a device layer including transistor devices 2105 and group 2112A of interconnects (e.g., six levels of interconnects) formed on the device layer. FIG. 4 also shows a via opening 213 formed from a top surface of the structure (as viewed) through a portion of substrate 2100. Via 213 may be formed by mask and etching techniques.

Figure 5:
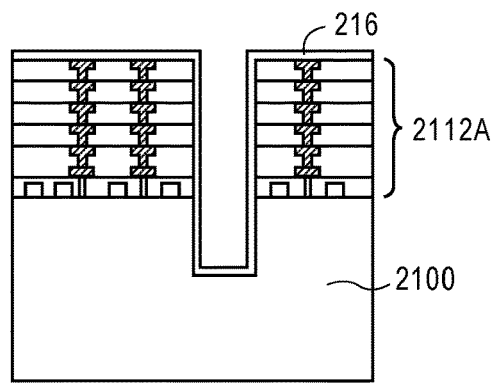
FIG. 5 illustrates the structure of FIG. 4 following passivation of a via opening, in accordance with an embodiment of the present disclosure.

FIG. 5 illustrates the structure of FIG. 4 following passivation of via opening 213. In one embodiment, via opening 213 is passivated with a dielectric material 216, such as silicon dioxide or a low-k material. In one embodiment, the dielectric material 216 is formed conformal with the top surface of the structure and with via opening 213.

Figure 6:
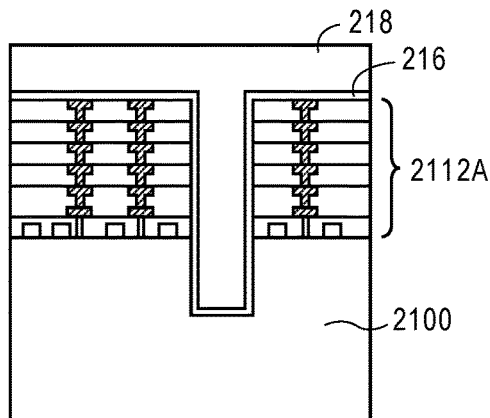
FIG. 6 illustrates the structure of FIG. 5 following deposition of an electrically conductive material in the via opening, in accordance with an embodiment of the present disclosure.

FIG. 6 illustrates the structure of FIG. 5 following deposition of an electrically conductive material 218 in the passivated via opening 213. In one embodiment, electrically conductive material 218 is or includes copper. In one embodiment, the surface and via opening of the structure are first seeded with seed material (e.g., a copper seed), followed by a deposition of electrically conductive material

218 by, for example, an electroplating process. In one embodiment, prior to seeding the via opening 213, the via opening may be lined with a diffusion barrier material such as a titanium material.

Figure 7:
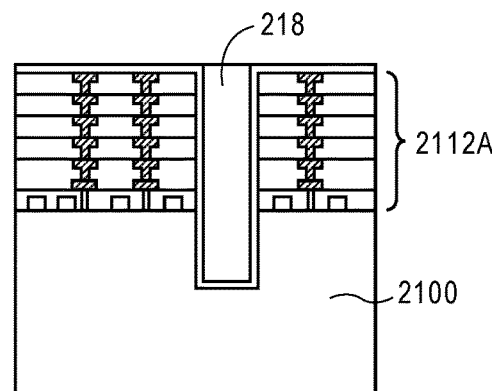
FIG. 7 illustrates the structure of FIG. 6 following confinement of an electrically conductive material to the via opening, in accordance with an embodiment of the present disclosure.

FIG. 7 illustrates the structure of FIG. 6 following confinement of electrically conductive material 218 to via opening 213. In one embodiment, electrically conductive material 218 is removed from a top surface of the structure by, for example, a chemical mechanical polish (CMP) to confine conductive material 218 to via opening 213. The confined conductive material may be referred to as a through silicon via (TSV), which may be at least partially surrounded by a dielectric material 216.

Figure 8:
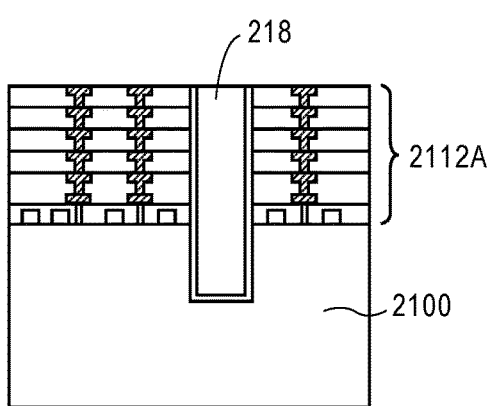
FIG. 8 illustrates the structure of FIG. 7 following removal of the dielectric material from a top surface of the structure, in accordance with an embodiment of the present disclosure.

FIG. 8 illustrates the structure of FIG. 7 following removal of dielectric material 216 from a top surface of the structure. In one embodiment, the removal may be performed by a CMP process, e.g., the same or a different CMP process used to confine conductive material 218 to via opening 213.

Figure 9:
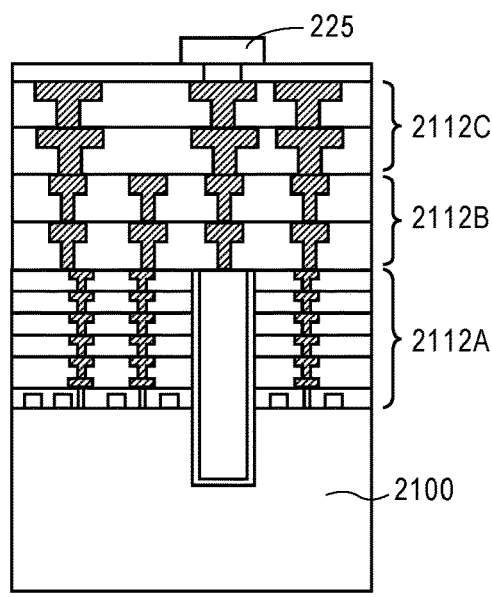
FIG. 9 illustrates the structure of FIG. 8 following formation of additional metal layers on the top surface of the structure resulting in the structure described with reference to FIG. 3, in accordance with an embodiment of the present disclosure.

FIG. 9 illustrates the structure of FIG. 8 following formation of additional metal layers on the top surface of the structure, providing a structure such as described in association with FIG. 3.

Figure 10:
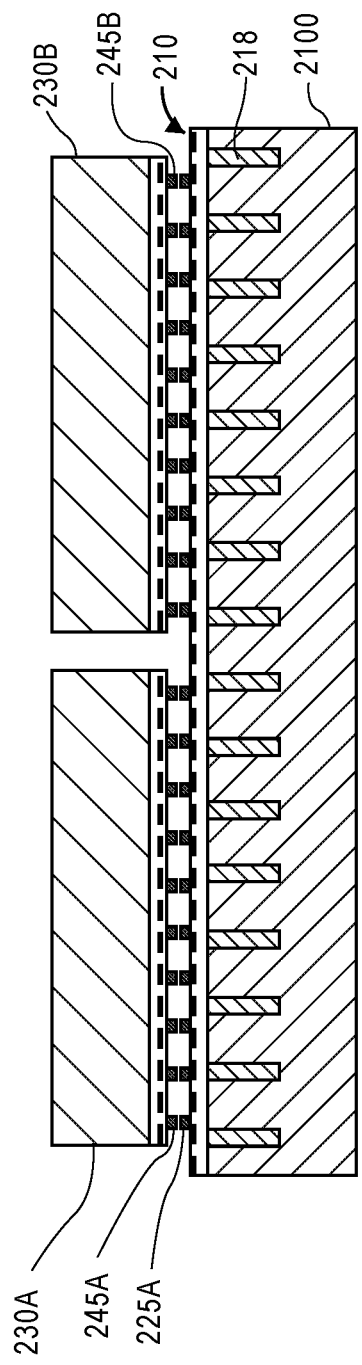
FIG. 10 illustrates the integrated circuit die of FIG. 3 following attachment of two integrated circuit dies thereto in a face-to-face configuration, in accordance with an embodiment of the present disclosure.

FIG. 10 illustrates the structure of FIG. 3 (or FIG. 10) following exemplary attachment of two integrated circuit dies to integrated circuit die 210. FIG. 10 shows die 230A and die 230B each including a device side and microbumps disposed on the device side. Microbumps 245A of die 230A and microbumps 245B of die 230B are connected to microbumps 225 of integrated circuit die 210 so that the die are connected in a face-to-face orientation. In one embodiment, the microbump pitch of the connection is 50 microns or less (e.g., 30 microns to 50 microns). As noted above, die 230A and die 230B may be independently selected for a particular function or functions (e.g., cores, graphics, FPGAs etc.) and may or may not be silicon-based technologies.

Figure 11:
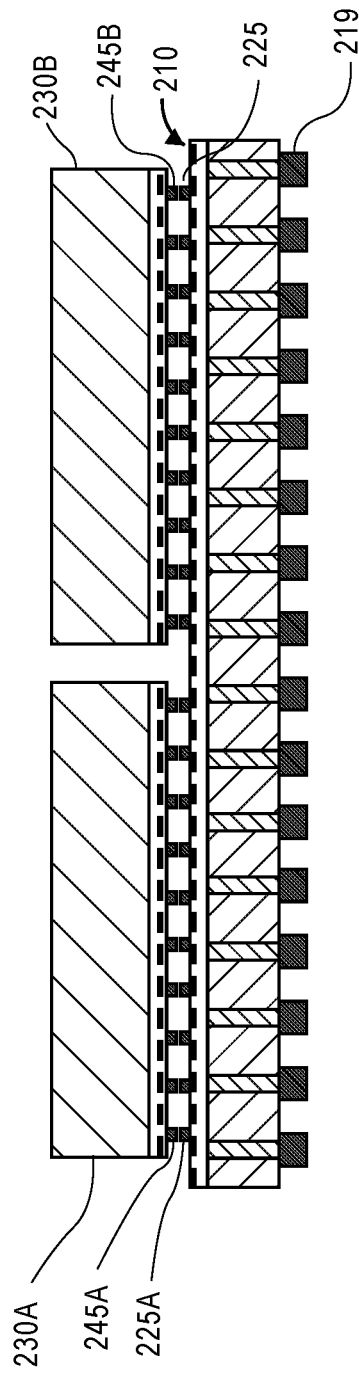
FIG. 11 illustrates the structure of FIG. 10 following thinning of the substrate of an integrated circuit die to expose through the silicon vias on a backside of the die, in accordance with an embodiment of the present disclosure.

FIG. 11 illustrates the structure of FIG. 10 following thinning of substrate 2100 of die 210 to expose through silicon vias (TSVs) 218 on a backside of die 210. In one embodiment, substrate 2100 is thinned to a thickness, for example, on the order of 80 microns, e.g., by a CMP process. Following thinning of the substrate 2100, solder bumps 219 may be formed on the exposed TSVs 218 to form package bumps for connection to a substrate package.

In one embodiment, the formation process described with respect to FIGS. 1-11 is performed at a wafer level wherein integrated circuit die 210 is one die of a larger wafer. In an embodiment, following formation of solder bumps 219, integrated circuit die 210 is singulated (e.g., separated) from other dies of the wafer.

In an embodiment, the integrated circuit dies described in the integrated circuit assembly have a device side contact point or microbump pitch for face-to-face connection on the order of 50 microns or less. Such an arrangement may allow for wider bus and more connections between dies 230A/230B and die 210. It is to be appreciated that with pitches of 50 microns or less, testing (probing) of such microbumps becomes challenging. Currently, a probe card pitch for testing and integrated circuit die is on the order of about 90 microns. Also, where the pitch of the microbumps on the individual die described herein is on the order of 50 microns or less, the size (e.g., diameter) of the individual microbumps is small (e.g., on the order of 20 μm or less). A representative probe tip of a probe card has a diameter on the order of 40 microns. Accordingly, the small tight-pitched microbumps may make it difficult to contact individual microbump with a probe tip without contacting any adjacent microbumps.

Figure 12:
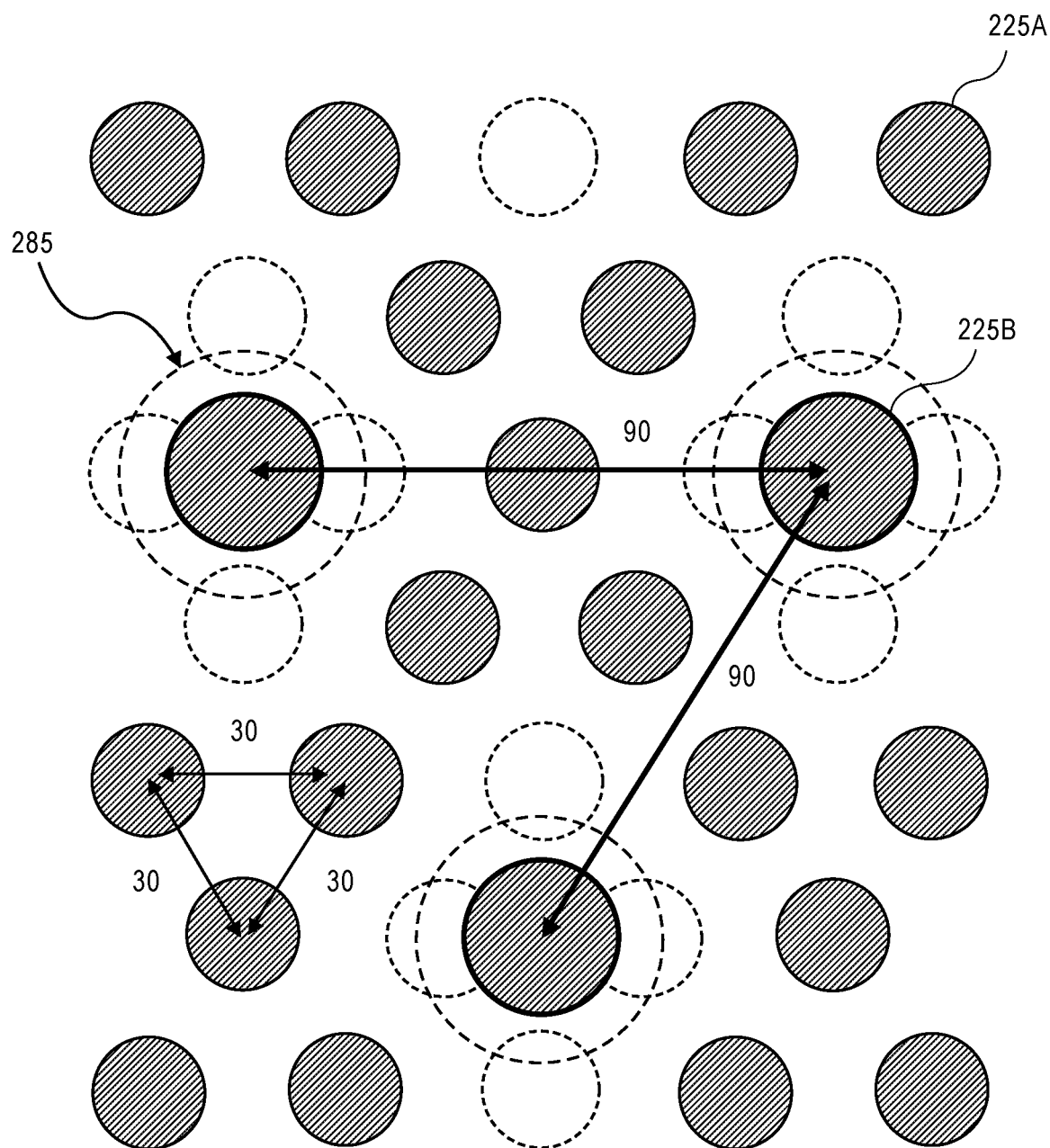
FIG. 12 illustrates an embodiment of a microbump pattern that is, for example, a pattern suitable for the microbumps of an integrated circuit die or microbumps of the dies, in accordance with an embodiment of the present disclosure.

FIG. 12 illustrates an embodiment of a microbump pattern that is, for example, a pattern suitable for microbumps 225 of integrated circuit die 210 or microbumps 245A of die 230A and microbumps 245B of die 230B. In this embodiment, it is possible that not all of the microbumps can be tested. Instead, to ensure that the resulting integrated circuit assembly formed includes known good die, a representative number less than all the microbumps are tested. In an embodiment, those tested microbumps are predetermined and made larger than others and areas around such predetermined microbumps are depopulated of other microbumps. The pattern of depopulated areas and larger tested bumps is repeated on mating die. FIG. 12 shows a top view of a portion of die 210. Integrated circuit die 210 includes microbumps 225 that include microbumps 225A that has, for example, a diameter on the order of 18 microns and microbumps 225B in certain unpopulated microbump areas that have a representative diameter on the order of 24 microns. As seen in FIG. 12, where microbumps 225B are present, the area around such microbumps is unpopulated. Therefore, in an embodiment, a probe card chip testing of microbumps 225B will not contact other microbumps. FIG. 12 representatively shows an illustration of a diameter of probe card chip 285 when it contacts microbump 225B. FIG. 12 shows microbumps 225 have a 90 micron pitch corresponding to a pitch of a current probe card making it possible to test such designated microbumps.

Figure 13:
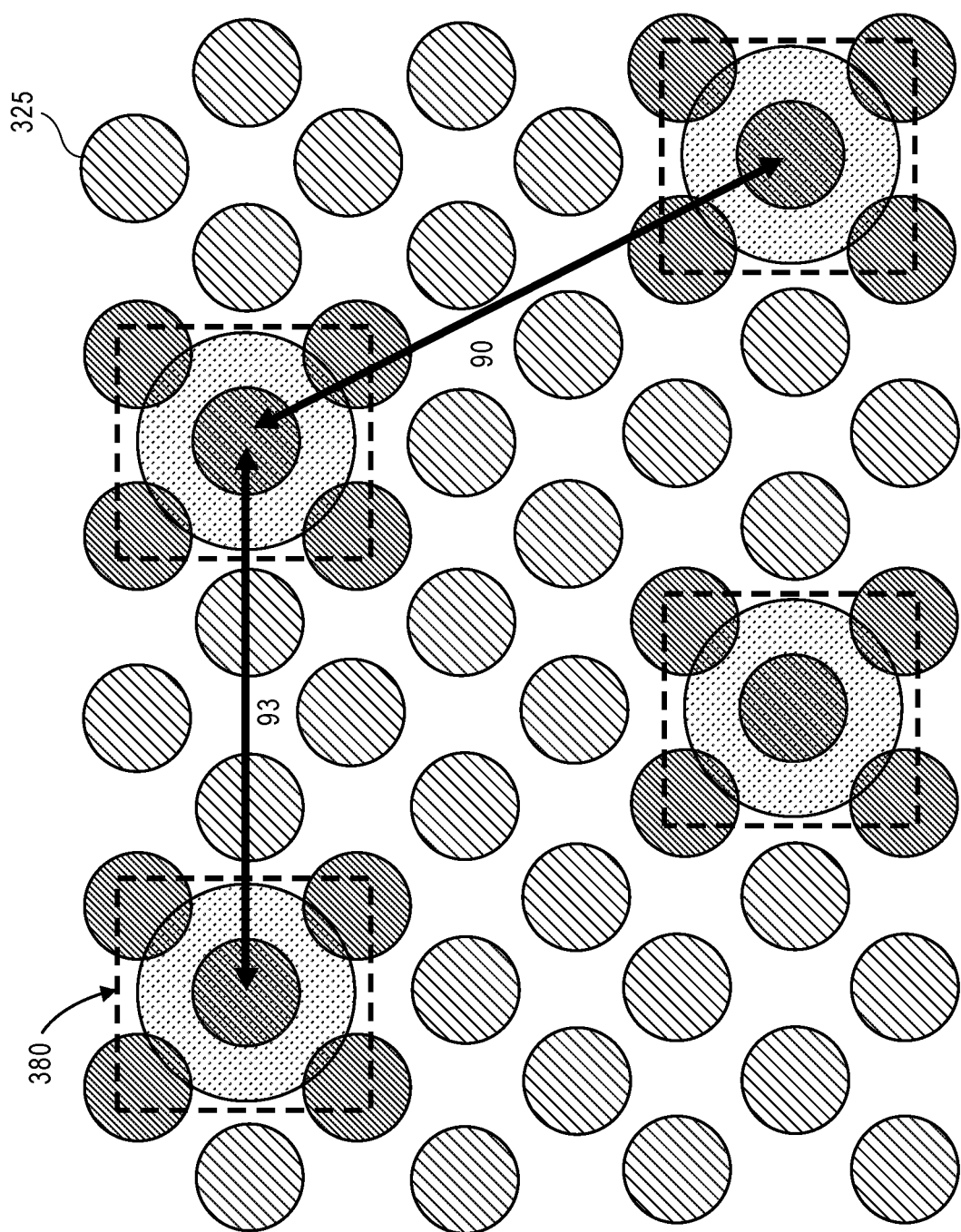
FIG. 13 illustrates another embodiment of a microbump pattern, in accordance with another embodiment of the present disclosure.

FIG. 13 illustrates another embodiment of a microbump pattern. In this embodiment, certain microbumps are again designated as ones to be probed. Rather than depopulating the microbumps, in this embodiment, the microbumps in an area to be tested are electrically connected such as by an underlying interconnect. FIG. 13 shows microbumps 325 having, for example, a representative pitch on the order of 30 microns. In one embodiment, in certain areas for microbumps predetermined or designated to be tested, five microbumps are electrically connected through an interconnect in, for example, a tenth interconnect layer. The interconnection of such microbumps is indicated by dashed lines 380. Such clusters of about five microbumps are, in one embodiment, spaced about 90 microns apart to require only a practical number of probe pins that have adequate landing margin on the underlying microbumps.

Figure 14:
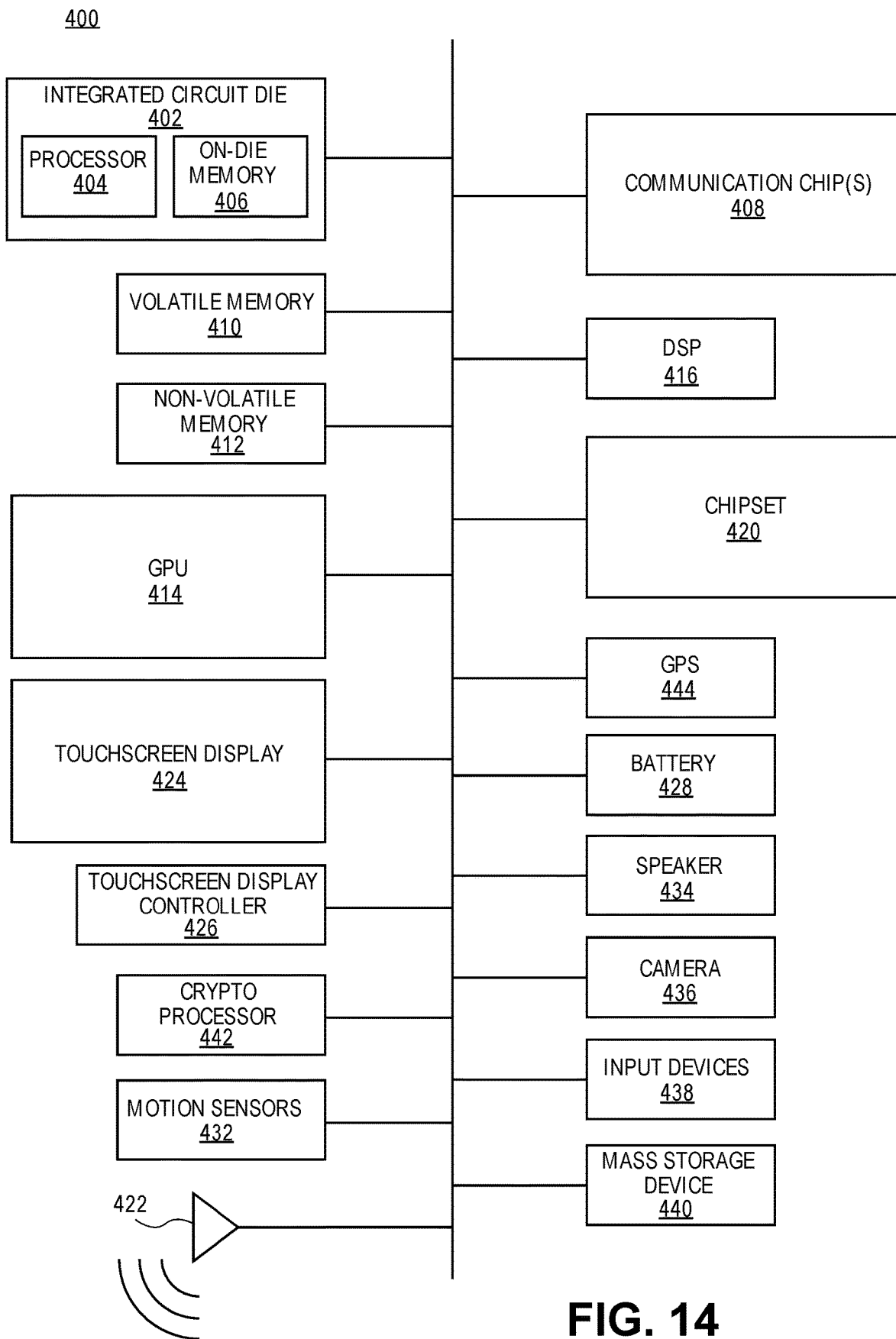
FIG. 14 illustrates a computing device, in accordance with an embodiment of the present disclosure.

FIG. 14 illustrates computing device 400 in accordance with one embodiment. Computing device 400 may include a number of components. In one embodiment, these components are attached to one or more motherboards. In an alternate embodiment, one or more of these components are fabricated onto a single assembly rather than a motherboard. The components in computing device 400 include, but are not limited to, integrated circuit die 402 and at least one communication chip 408. In some implementations communication chip 408 is fabricated as part of integrated circuit die 402 as part of an integrated circuit assembly such as described above. The assembly may include CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an integrated circuit assembly such as described above. These other components may include, but are not limited to, volatile memory 410

(e.g., DRAM), non-volatile memory 412 (e.g., ROM or flash memory), graphics processing unit 414 (GPU), digital signal processor 416, crypto processor 442 (e.g., a specialized processor that executes cryptographic algorithms within hardware), chipset 420, antenna 422, display or a touchscreen display 424, touchscreen controller 426, battery 428 or other power source, a power amplifier (not shown), global positioning system (GPS) device 444, a compass, motion coprocessor or sensors 432 (that may include an accelerometer, a gyroscope, and a compass), speaker 434, camera 436, user input devices 438 (such as a keyboard, mouse, stylus, and touchpad), and mass storage device 440 (such as hard disk drive, compact disk (CD), digital versatile disk (DVD), and so forth).

Communications chip 408 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

In various embodiments, computing device 400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

Thus, embodiments of the present disclosure include hyperchip structures and methods of fabricating hyperchips.

The above description of illustrated implementations, including what is described in the Abstract, is not intended to be exhaustive or to limit the disclosure to the precise forms disclosed. While specific implementations of, and examples for, the disclosure are described herein for illustrative purposes, various equivalent modifications are possible within the scope, as those skilled in the relevant art will recognize. These modifications may be made in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit assembly includes a first integrated circuit chip having a device side opposite a backside. The device side includes a plurality of transistor devices and a plurality of device side contact points. The backside includes a plurality of backside contacts. A second integrated circuit chip includes a device side having a plurality of device contact points thereon. The second integrated circuit chip is on the first integrated circuit chip in a device side to device side configuration. Ones of the plurality of device contact points of the second integrated circuit chip are coupled to ones of the plurality of device contact points of the first integrated circuit chip. The second integrated circuit chip is smaller than the first integrated circuit chip from a plan view perspective.

Example embodiment 2: The integrated circuit assembly of example embodiment 1, further including one or more additional integrated circuit chips, each of the one or more additional integrated circuit chips having a device side with a plurality of device contact points thereon. Each of the one or more additional integrated circuit chips is on the first integrated circuit chip in a device side to device side configuration, where ones of the plurality of device contact points of each of the one or more additional integrated circuit chips are coupled to ones of the plurality of device contact points of the first integrated circuit chip. Each of the one or more additional integrated circuit chips is smaller than the first integrated circuit chip from a plan view perspective.

Example embodiment 3: The integrated circuit assembly of example embodiment 2, wherein at least one of the one or more additional integrated circuit chips has a different functionality than a functionality of the second integrated circuit chip.

Example embodiment 4: The integrated circuit assembly of example embodiment 1, 2 or 3, wherein the first integrated circuit chip includes one or more through silicon vias (TSVs) extending between the device side and the backside, the one or more TSVs electrically coupled to the backside contacts.

Example embodiment 5: The integrated circuit assembly of example embodiment 1, 2, 3 or 4, wherein the backside contacts include solder bumps.

Example embodiment 6: The integrated circuit assembly of example embodiment 4, wherein the one or more TSVs are at least partially surrounded by a dielectric material.

Example embodiment 7: The integrated circuit assembly of example embodiment 1, 2, 3, 4, 5 or 6, wherein a subset of the device side contact points of the first integrated circuit chip are located in depopulated regions and have a larger diameter than others of the device side contact points of the first integrated circuit chip.

Example embodiment 8: The integrated circuit assembly of example embodiment 1, 2, 3, 4, 5, 6 or 7, wherein the plurality of device contact points of the second integrated circuit chip have a same pattern as the device side contact points of the first integrated circuit chip.

Example embodiment 9: A packaged system includes a package substrate having die side contacts. An integrated circuit assembly is coupled to the package substrate. The integrated circuit assembly includes a first integrated circuit chip including a device side opposite a backside, the device side having a plurality of transistor devices and a plurality of device side contact points, and the backside having a plurality of backside contacts electrically coupled to the die side contacts of the package substrate. The integrated circuit also includes a second integrated circuit chip including a device side and a backside, the device side having a plurality of device contact points thereon, the second integrated circuit chip on the first integrated circuit chip in a device side to device side configuration. Ones of the plurality of device contact points of the second integrated circuit chip are coupled to ones of the plurality of device contact points of the first integrated circuit chip. The second integrated circuit chip is smaller than the first integrated circuit chip from a plan view perspective. The packaged system further includes a heat sink coupled to the backside of the second integrated circuit chip.

Example embodiment 10: The packaged system of example embodiment 9, wherein the integrated circuit assembly further includes one or more additional integrated circuit chips. Each of the one or more additional integrated circuit chips having a device side with a plurality of device contact points thereon. Each of the one or more additional integrated circuit chips on the first integrated circuit chip in a device side to device side configuration. Ones of the plurality of device contact points of each of the one or more additional integrated circuit chips are coupled to ones of the plurality of device contact points of the first integrated circuit chip. Each of the one or more additional integrated circuit chips is smaller than the first integrated circuit chip from a plan view perspective.

Example embodiment 11: The packaged system of example embodiment 10, wherein at least one of the one or more additional integrated circuit chips has a different functionality than a functionality of the second integrated circuit chip.

Example embodiment 12: The packaged system of example embodiment 9, 10 or 11, wherein the first integrated circuit chip of the integrated circuit assembly has one or more through silicon vias (TSVs) extending between the device side and the backside, the one or more TSVs electrically coupled to the backside contacts.

Example embodiment 13: The packaged system of example embodiment 9, 10, 11 or 12, wherein the backside contacts include solder bumps.

Example embodiment 14: The packaged system of example embodiment 12, wherein the one or more TSVs are at least partially surrounded by a dielectric material.

Example embodiment 15: The packaged system of example embodiment 9, 10, 11, 12, 13 or 14, wherein a subset of the device side contact points of the first integrated circuit chip of the integrated circuit assembly are located in depopulated regions and have a larger diameter than others of the device side contact points of the first integrated circuit chip.

Example embodiment 16: The packaged system of example embodiment 9, 10, 11, 12, 13, 14 or 15, wherein the plurality of device contact points of the second integrated circuit chip of the integrated circuit assembly have a same pattern as the device side contact points of the first integrated circuit chip.

Example embodiment 17: An integrated circuit assembly includes an integrated circuit chip having a device side opposite a backside. The device side includes a plurality of transistor devices and a plurality of device side contact points. The backside includes a plurality of backside contacts. The integrated circuit assembly also includes a plurality of additional integrated circuit chips. Each of the plurality of additional integrated circuit chips has a device side including a plurality of device contact points thereon. Each of the plurality of additional integrated circuit chips is on the integrated circuit chip in a device side to device side configuration. Ones of the plurality of device contact points of each of the plurality of additional integrated circuit chips are coupled to ones of the plurality of device contact points of the integrated circuit chip. Each of the plurality of additional integrated circuit chips is smaller than the integrated circuit chip from a plan view perspective.

Example embodiment 18: The integrated circuit assembly of example embodiment 17, wherein the integrated circuit chip includes one or more through silicon vias (TSVs) extending between the device side and the backside, the one or more TSVs electrically coupled to the backside contacts.

Example embodiment 19: The integrated circuit assembly of example embodiment 17 or 18, wherein the backside contacts include solder bumps.

Example embodiment 20: The integrated circuit assembly of example embodiment 18, wherein the one or more TSVs are at least partially surrounded by a dielectric material.

Example embodiment 21: The integrated circuit assembly of example embodiment 17, 18, 19 or 20, wherein a subset of the device side contact points of the integrated circuit chip are located in depopulated regions and have a larger diameter than others of the device side contact points of the integrated circuit chip.

Example embodiment 22: The integrated circuit assembly of example embodiment 21, wherein the plurality of device contact points of each of the plurality of additional integrated circuit chips have a same pattern as the device side contact points of the integrated circuit chip.

What is claimed is:

1. An integrated circuit assembly, comprising:
    a first integrated circuit die comprising:
        a first substrate;
        a device region on the first substrate including a plurality of transistor devices;
        a first interconnect level over the device region;
        a second interconnect level over the first interconnect level;
        a third interconnect level over the second interconnect level;
        a device contact point over the third interconnect level;
        a backside contact at an opposite side of the first substrate than the device region;

a through silicon via (TSV), the TSV extending from the backside contact through the first substrate to a location between the first interconnect level and the third interconnect level; and wherein the first integrated circuit die has a footprint; and a second integrated circuit die comprising:
a second substrate;
a second device region on the second substrate;
a device side including a device contact point thereon;
a backside opposite the device side; and
wherein the second integrated circuit die is located over the first integrated circuit die, and wherein the device contact point of the second integrated circuit die is coupled to the device contact point of the first integrated circuit die, and wherein the second integrated circuit die has a footprint within the footprint of the first integrated circuit die.

2. The integrated circuit assembly of claim 1, wherein the footprint of the second integrated circuit die is smaller than the footprint of the first integrated circuit die.

3. The integrated circuit assembly of claim 1, further comprising:
a third integrated circuit die on the first integrated circuit die in a device side to device side configuration.

4. The integrated circuit assembly of claim 1, the first integrated circuit die further comprising:
a fourth interconnect level between the first interconnect level and the third interconnect level; and
a fifth interconnect level between the fourth interconnect level and the third interconnect level.

5. The integrated circuit assembly of claim 1, wherein the second integrated circuit die is a multi-core CPU die.

6. The integrated circuit assembly of claim 1, wherein the second integrated circuit die is a graphics die.

7. A method of fabricating an integrated circuit assembly, the method comprising:
forming a first integrated circuit die, wherein forming the first integrated circuit die comprises:
forming a device region on a first substrate, the device region including a plurality of transistor devices;
forming a first interconnect level over the device region;
forming a second interconnect level over the first interconnect level;
forming a third interconnect level over the second interconnect level;
forming a device contact point over the third interconnect level;
forming a backside contact at an opposite side of the first substrate than the device region;
forming a through silicon via (TSV), the TSV extending from the backside contact through the first substrate to a location between the first interconnect level and the third interconnect level; and
wherein the first integrated circuit die has a footprint; and
forming a second integrated circuit die, wherein forming the second integrated circuit die comprises:
forming a second device region on a second substrate;
forming a device side including a device contact point thereon;
forming a backside opposite the device side; and
wherein the second integrated circuit die is located over the first integrated circuit die, and wherein the device contact point of the second integrated circuit die is coupled to the device contact point of the first integrated circuit die, and wherein the second integrated circuit die has a footprint within the footprint of the first integrated circuit die.

8. The method of claim 7, wherein the footprint of the second integrated circuit die is smaller than the footprint of the first integrated circuit die.

9. The method of claim 7, further comprising:
providing a third integrated circuit die on the first integrated circuit die in a device side to device side configuration.

10. The method of claim 7, wherein forming the first integrated circuit die further comprises:
forming a fourth interconnect level between the first interconnect level and the third interconnect level; and
forming a fifth interconnect level between the fourth interconnect level and the third interconnect level.

11. The method of claim 7, wherein the second integrated circuit die is a multi-core CPU die.

12. The method of claim 7, wherein the second integrated circuit die is a graphics die.

13. A system, comprising:
a package substrate;
a first integrated circuit die coupled to the package substrate, the first integrated circuit die comprising:
a first substrate;
a device region on the first substrate including a plurality of transistor devices;
a first interconnect level over the device region;
a second interconnect level over the first interconnect level;
a third interconnect level over the second interconnect level;
a device contact point over the third interconnect level;
a backside contact at an opposite side of the first substrate than the device region;
a through silicon via (TSV), the TSV extending from the backside contact through the first substrate to a location between the first interconnect level and the third interconnect level; and
wherein the first integrated circuit die has a footprint; and
a second integrated circuit die comprising:
a second substrate;
a second device region on the second substrate;
a device side including a device contact point thereon;
a backside opposite the device side; and
wherein the second integrated circuit die is located over the first integrated circuit die, and wherein the device contact point of the second integrated circuit die is coupled to the device contact point of the first integrated circuit die, and wherein the second integrated circuit die has a footprint within the footprint of the first integrated circuit die.

14. The system of claim 13, further comprising:
a heat sink above the second integrated circuit die.

15. The system of claim 13, further comprising:
a plurality of solder balls on a side of the package substrate opposite the first integrated circuit die.

16. The system of claim 13, wherein the footprint of the second integrated circuit die is smaller than the footprint of the first integrated circuit die.

17. The system of claim 13, further comprising:
a third integrated circuit die on the first integrated circuit die in a device side to device side configuration.

18. The system of claim 17, further comprising:
a fourth integrated circuit die on the first integrated circuit die in a device side to device side configuration.

19. The system of claim 13, wherein the second integrated circuit die is a multi-core die.

20. The system of claim 13, wherein the second integrated circuit die is a graphics die.

* * * * *